(12) United States Patent
Ido

(10) Patent No.: US 6,621,863 B1
(45) Date of Patent: Sep. 16, 2003

(54) EQUALIZING APPARATUS COMBINING AMPLITUDE ERROR WITH SQUARED ENVELOPE ERROR ACCORDING TO VARIABLE WEIGHTS

(75) Inventor: Jun Ido, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/488,550

(22) Filed: Jan. 21, 2000

(30) Foreign Application Priority Data

Mar. 31, 1999 (JP) .......................................... 11-090957

(51) Int. Cl.⁷ ............................................. H03K 5/159
(52) U.S. Cl. ...................... 375/232; 375/226; 375/269; 375/273; 375/279; 375/280; 375/283; 375/325; 375/324
(58) Field of Search ................................ 375/226, 269, 375/273, 279, 280, 283, 325, 324, 232

(56) References Cited

U.S. PATENT DOCUMENTS

| | | | | |
|---|---|---|---|---|
| 5,230,077 A | * | 7/1993 | Raith | 455/65 |
| 5,311,546 A | * | 5/1994 | Paik et al. | 375/232 |
| 5,517,530 A | * | 5/1996 | Gardner | 375/325 |
| 5,524,126 A | * | 6/1996 | Clewer et al. | 375/355 |
| 5,777,692 A | * | 7/1998 | Ghosh | 348/725 |
| 6,327,302 B1 | * | 12/2001 | Shen | 375/232 |

OTHER PUBLICATIONS

Benvenis et al., Blind Equalizers, IEEE Transactions on Communications, vol. Com–32, No. 8, 871–883 (1984).

Deshpande, Fast Recovery Equalization Techniques for DTV Signals, IEEE Transactions on Communications, vol. 43, No. 4, 370–377 (1997).

* cited by examiner

Primary Examiner—Stephen Chin
Assistant Examiner—Guillermo Munoz
(74) Attorney, Agent, or Firm—Birch, Stewart, Kolasch, Birch, LLP.

(57) ABSTRACT

An equalizer providing a filtered signal to a data decision unit calculates an amplitude error signal by comparing the filtered signal with the data signal output from the data decision unit, and calculates a squared envelope error signal from the filtered signal. These two error signals are separately weighted according to the absolute value of the amplitude error, the weight of the amplitude error signal decreasing and the weight of the squared envelope error signal increasing as the absolute value of the amplitude error increases. The weighted amplitude error signal and weighted squared envelope error signal are added to obtain an error signal used in updating filter coefficients in the equalizer. Rapid convergence of the filter coefficients is obtained, with small residual error.

18 Claims, 15 Drawing Sheets

EQUALIZING APPARATUS COMBINING AMPLITUDE ERROR WITH SQUARED ENVELOPE ERROR ACCORDING TO VARIABLE WEIGHTS

BACKGROUND OF THE INVENTION

The present invention relates to an equalizer for use in a receiver receiving a signal modulated by a method such as quadrature phase-shift keying (QPSK), multi-level quadrature amplitude modulation (m-QAM), or multi-level vestigial sideband (m-VSB) modulation.

QPSK, m-QAM, and m-VSB are digital modulation methods employed in various types of communication systems, including digital telephone and television systems. QPSK modulates a pair of carrier signals having identical frequencies and mutually orthogonal phase, generating a combined carrier signal with a phase that shifts in steps of ninety degrees (90°). In m-QAM, each of the two orthogonal carrier signals is modulated on multiple discrete amplitude levels, generating a combined carrier that varies in both amplitude and phase. In m-VSB, a single carrier signal is modulated at multiple discrete levels.

The modulated carrier signal is transmitted over a channel that distorts the amplitude and phase of the signal. The function of an equalizer is to correct the distortion, so that accurate data can be recovered from the demodulated signal. The distortion is removed by filtering the demodulated signal, using a digital filter. The coefficients in the digital filter are updated according to an error signal representing the residual error present in the filtered signal, so as to minimize the residual error. The performance of the equalizer depends strongly on the way in which the error signal is obtained.

A first type of error signal, referred to below as an amplitude error signal, is equal to the difference between the filtered signal and the recovered data values. This error signal is ideal when the recovered data values are correct, but is less useful when the data values are unreliable. Unreliable data values occur when there is large channel distortion, when the received signal is incompletely demodulated, and in the early stages of convergence, when the filter coefficients are still far from their optimal values.

A second type of error signal, referred to below as a squared envelope error signal, is obtained by comparing the squared absolute value of the received signal with a dispersion factor derived from the expected value of the squared absolute value. This error signal is useful during the initial stages of convergence, when the expected amplitude of the filtered signal is known, at least in a statistical sense, even though the recovered data values are unreliable. This error signal is also useful under the above-mentioned conditions of large channel distortion and incomplete demodulation. Under more favorable conditions, however, once the filter coefficients have converged and the amplitude error is small, the squared envelope error is virtually useless for updating the filter coefficients.

A third type of error signal is obtained by adding the above two error signals together, after multiplication by appropriate fixed constants. Since the squared envelope error is more useful when the amplitude error is large than when the amplitude error is small, the squared envelope error is also multiplied by the absolute value of the amplitude error. As a result, during initial convergence and under other conditions that produce large amplitude errors, the enhanced squared envelope component of the error signal guides the filter coefficients toward their correct values. As the filter coefficients approach convergence, the squared envelope component diminishes in weight, and the amplitude error component operates to complete the convergence process and maintain the converged state.

This type of combined error signal is not entirely satisfactory, however, for the following reasons.

In the early convergence stages, or under other adverse conditions, although the squared envelope component of the error signal is enhanced, the amplitude error component is also large, and its reliability is low. Incorrect amplitude error values, caused by incorrect data values, tend to slow the convergence of the filter coefficients.

After the filter coefficients have converged, under favorable conditions, although the squared envelope error component of the error signal is reduced, it does not disappear, and its continued presence tends to perturb the filter coefficients. In particular, the equalizer becomes overly sensitive to channel noise, and the residual error after convergence is far higher than the theoretical limit.

SUMMARY OF THE INVENTION

An object of the present invention is to provide an equalizing apparatus that combines rapid convergence with low residual error.

Another object is to obtain an appropriate error signal under a variety of conditions.

Another object is to provide an equalizing apparatus that is compatible with different modulation methods.

In the invented equalizing apparatus, a digital filter filters an input signal to correct channel distortion. A data decision unit obtains a data signal from the filtered signal, the data signal having values in accordance with a signal modulation method. An error signal generator receives the filtered signal and the data signal and generates an error signal for use in updating filter coefficients in the digital filter. The error signal generator comprises:

an amplitude error signal generator generating an amplitude error signal from the filtered signal and the data signal;

a squared envelope error signal generator generating a squared envelope error signal from the filtered signal;

a weighting coefficient calculation unit calculating a weighting coefficient from an absolute value of the amplitude error signal;

an amplitude error signal weighting unit weighting the amplitude error signal according to a first fixed constant and the calculated weighting coefficient;

a squared envelope error signal weighting unit weighting the squared envelope error signal according to a second fixed constant and the calculated weighting coefficient; and an adder adding the weighted amplitude error signal and the weighted squared envelope error signal to obtain the error signal output by said error signal generator.

By weighting both the amplitude error signal and the squared envelope error signal, the error signal generator is able to generate an error signal in which the amplitude error component is reduced or absent when the amplitude error is large, and in which the squared envelope error component is completely absent when the amplitude error is small. This error signal leads to comparatively fast convergence of the filter coefficients under conditions producing large amplitude error, and to small residual error under conditions producing small amplitude error.

The invented equalizing apparatus may also include a parameter selector selecting parameters such as the first and second fixed constants according to the signal modulation method, enabling the apparatus to be used with a variety of modulation methods.

DETAILED DESCRIPTION OF THE INVENTION

Figure 1:
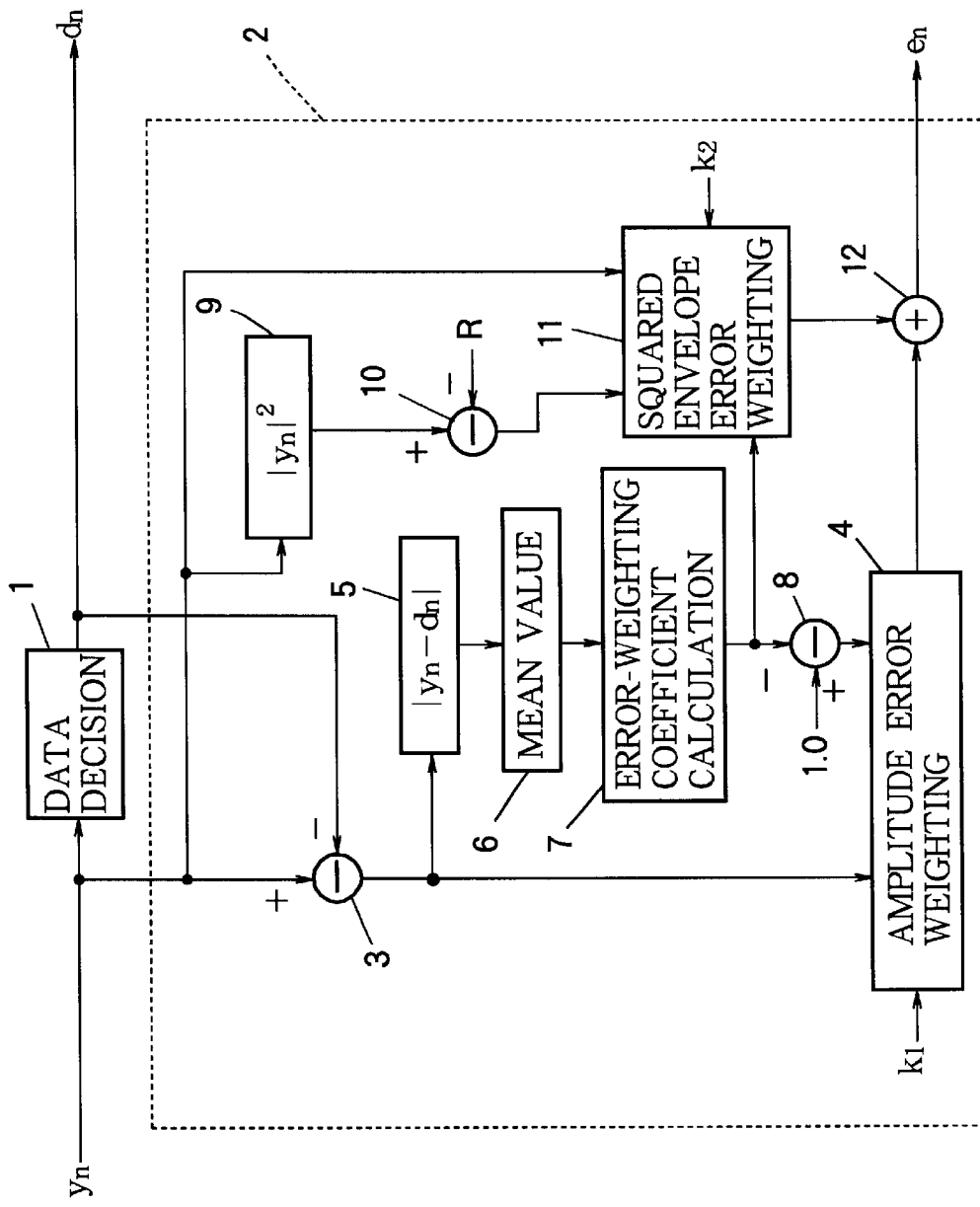
FIG. 1 is a block diagram showing the internal structure of the error signal generator in a first embodiment of the invention.

Embodiments of the invention will be described with reference to the attached drawings, in which like parts are indicated by like reference characters.

Referring to FIG. 1, in a first embodiment, the filtered signal $y_n$ input to the data decision unit 1 and the data signal $d_n$ output from the data decision unit 1 are supplied to an error signal generator 2 that generates an error signal $e_n$. The subscript (n) denotes time in discrete units. The error signal generator 2 comprises a subtractor 3 that receives $y_n$ and $d_n$, and an amplitude error signal weighting unit 4 that generates a weighted amplitude error signal from the output of the subtractor 3, a fixed constant $k_1$, and a weighting coefficient described below. The error signal generator 2 also comprises an absolute value calculation unit 5 that receives the output of the subtractor 3; a mean value calculation unit 6 that receives the output of the absolute value calculation unit 5; an error-weighting coefficient calculation unit 7 that receives the output of the mean value calculation unit 6; a subtractor 8 that subtracts the output of the error-weighting coefficient calculation unit 7 from unity to obtain the weighting coefficient supplied to the amplitude error signal weighting unit 4; a squared envelope calculation unit 9 that receives the filtered signal $y_n$; a subtractor 10 that subtracts a positive constant R from the output of the squared envelope calculation unit 9; a squared envelope error signal weighting unit 11 that generates a weighted squared envelope error signal from the filtered signal $y_n$, the output of the error-weighting coefficient calculation unit 7, the output of the subtractor 10, and a fixed constant $k_2$; and an adder 12 that receives the weighted amplitude error signal output from the amplitude error signal weighting unit 4 and the weighted squared envelope error signal output from the squared envelope error signal weighting unit 11 and generates the error signal $e_n$.

The data decision unit 1 compares the filtered signal $y_n$ with a plurality of data values, predetermined according to the modulation method, and selects the closest of these predetermined data values for output as $d_n$. Depending on the modulation method, the filtered signal $y_n$ and data signal $d_n$ may represent real-valued amplitudes, as in m-VSB, or points in a constellation of complex values, as in QPSK and m-QAM. Complex values are obtained by regarding the two orthogonal carrier components used in QPSK and m-QAM as the real and imaginary parts of a complex number. The term 'amplitude' will be used below to refer to both real and complex values.

The subtractor 3 operates as an amplitude error signal generator, subtracting the data value $d_n$ from the filtered signal $y_n$ to obtain the amplitude error signal $(y_n - d_n)$. If $d_n$ is correct, the amplitude error signal represents the deviation of the filtered signal from the transmitted value.

The amplitude error signal weighting unit 4 multiplies the amplitude error signal output from the subtractor 3 by the fixed constant $k_1$ and a weighting coefficient $(1-w_n)$ to obtain the weighted amplitude error signal.

The absolute value calculation unit 5 calculates the absolute value of the amplitude error signal $(|y_n - d_n|)$.

The mean value calculation unit 6 calculates the mean value $\epsilon_n$ of the absolute amplitude error signal received from the absolute value calculation unit 5 over a certain interval of fixed duration up to the present time (n).

The error-weighting coefficient calculation unit 7 uses the mean value $\epsilon_n$ received from the mean value calculation unit 6 to calculate a weighting coefficient $w_n$, which is supplied to the subtractor 8 and squared envelope error signal weighting unit 11. In combination, the absolute value calculation unit 5, mean value calculation unit 6, and error-weighting coefficient calculation unit 7 form a weighting coefficient calculation unit that uses a predetermined conversion function to obtain a weighting coefficient that determines the relative weighting of the amplitude error signal and squared envelope error signal when these two signals are added.

The subtractor 8 subtracts $w_n$ from the maximum weight value, represented below as a value of unity, to obtain the weighting coefficient $(1-w_n)$ supplied to the amplitude error signal weighting unit 4. The amplitude error signal weighting unit 4 and subtractor 8 in combination form a weighting unit that weights the amplitude error signal according to the calculated weighting coefficient ($w_n$) and the first fixed constant ($k_1$).

The squared envelope calculation unit 9 obtains a squared envelope signal having a value equal to the squared absolute value ($|y_n|^2$) of the filtered signal.

The subtractor 10 subtracts the positive constant R from the squared envelope signal received from the squared envelope calculation unit 9 to obtain a squared envelope error signal. The squared envelope calculation unit 9 and subtractor 10 in combination constitute a squared envelope error signal generator that generates the squared envelope error signal, which approximates the squared envelope error of the filtered signal $y_n$.

The squared envelope error signal weighting unit 11 multiplies the squared envelope error signal by the filtered signal $y_n$, the fixed constant $k_2$, and the weight $w_n$ received from the error-weighting coefficient calculation unit 7 to obtain the weighted squared envelope error signal.

The adder 12 adds the weighted amplitude error signal received from the amplitude error signal weighting unit 4 to the weighted squared envelope error signal received from the squared envelope error signal weighting unit 11 to obtain the error signal $e_n$ output from the error signal generator 2.

It the filtered signal and data signal are complex-valued, then the subtractor 3, amplitude error signal an weighting unit 4, squared envelope error signal weighting unit 11, and adder 12 perform complex arithmetic operations, and the error signal $e_n$ is also complex-valued.

Figure 2:
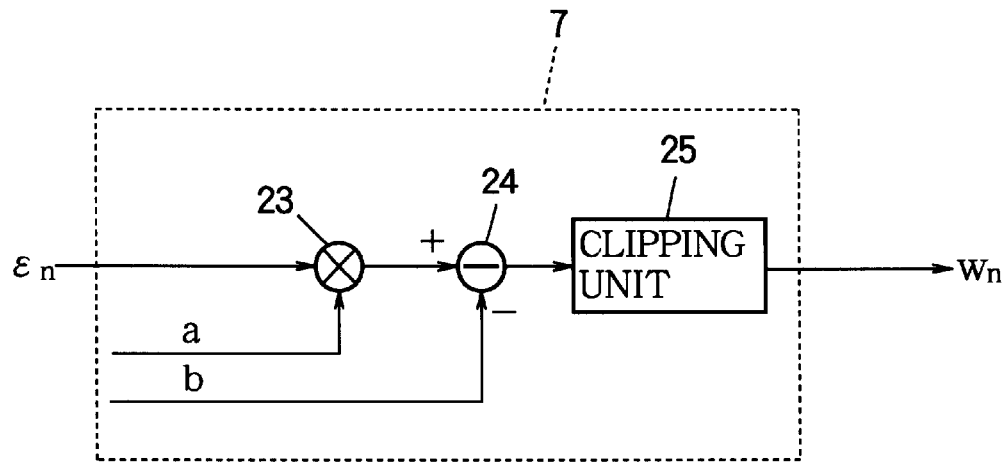
FIG. 2 is a block diagram showing a first example of the internal structure of the error-weighting coefficient calculation unit in FIG. 1.

FIG. 2 shows an example of the internal structure of the error-weighting coefficient calculation unit 7 in FIG. 1, comprising a multiplier 23, a subtractor 24, and a clipping unit 25. The error-weighting coefficient calculation unit 7 in this example is provided with a pair of parameters (a, b), both of which are positive constants. The multiplier 23 multiplies the mean value $\epsilon_n$ output from the mean value calculation unit 6 by the first parameter (a). The subtractor 24 subtracts the second parameter (b) from the resulting product. The clipping unit 25 clips the resulting difference by changing values less than zero to zero, and changing values greater than one to one. The result is a weighting coefficient $w_n$ in the range from zero to one, inclusive.

Figure 3:
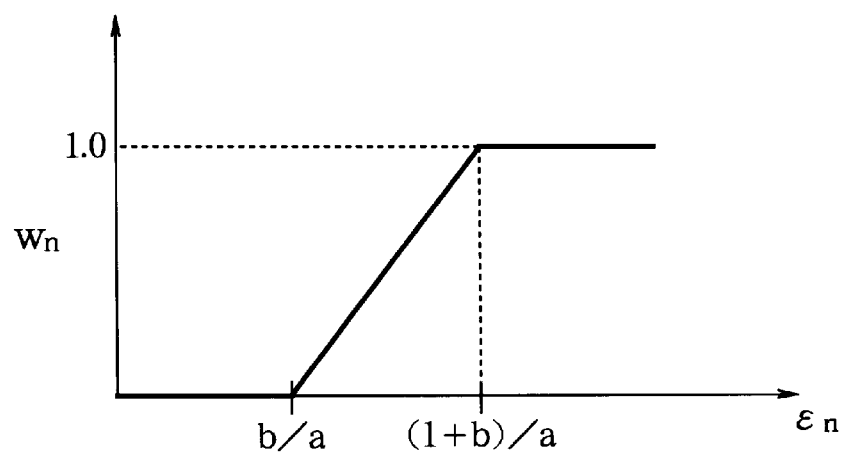
FIG. 3 is a graph illustrating the operation of the error-weighting coefficient calculation unit in FIG. 2.

FIG. 3 illustrates the operation of the error-weighting coefficient calculation unit 7 in FIG. 2, showing the input mean value $\epsilon_n$ on the horizontal axis and the output weighting coefficient $w_n$ on the vertical axis. The function that converts $\epsilon_n$ to $w_n$ is a piecewise linear function.

Figure 4:
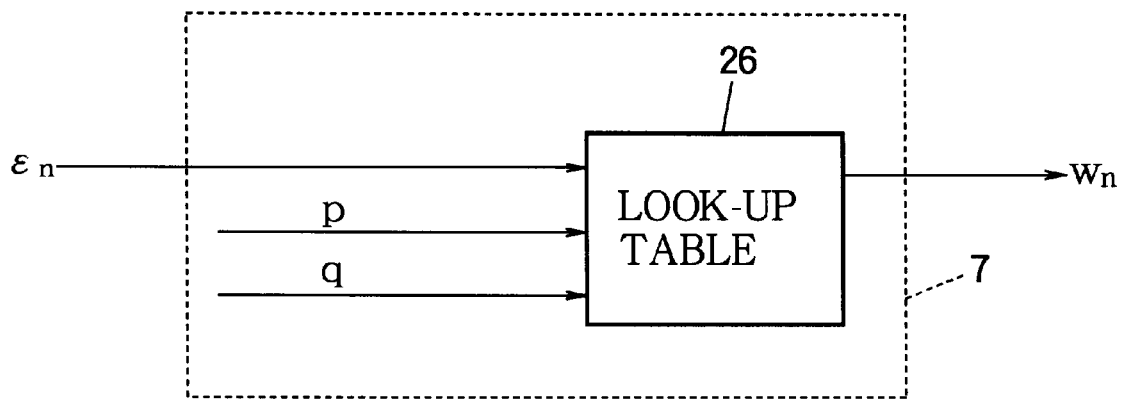
FIG. 4 is a block diagram showing a second example of the internal structure of the error-weighting coefficient calculation unit in FIG. 1.

FIG. 4 shows another example of the internal structure of the error-weighting coefficient calculation unit 7, comprising a look-up table 26. The inputs to the look-up table 26 are the mean value $\epsilon_n$ output from the mean value calculation unit 6, and a pair of positive parameters (p, q). The look-up table 26 has memory and arithmetic circuits that generate a weighting coefficient $w_n$ given by the following formula.

$$w_n = \begin{cases} 0; & 0 \leq \epsilon_n \leq p-q, \\ \frac{1}{2}\left\{1 + \sin\frac{(\epsilon_n - p)\pi}{2q}\right\}; & p-q < \epsilon_n < p+q, \\ 1; & p+q \leq \epsilon_n \end{cases}$$

Figure 5:
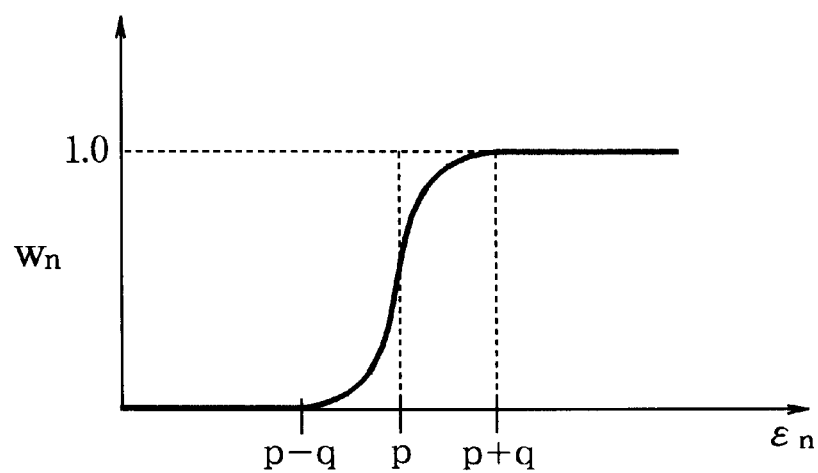
FIG. 5 is a graph illustrating the operation of the error-weighting coefficient calculation unit in FIG. 4.

FIG. 5 illustrates the operation of the error-weighting coefficient calculation unit 7 in FIG. 4, showing the input mean value $\epsilon_n$ on the horizontal axis and the output weight $w_n$ on the vertical axis. Input values less than p−q are converted to zero, while input values greater than p+q are converted to one. The conversion function is generally similar to the function in FIG. 3, but varies smoothly instead of in a piecewise linear fashion.

The conversion functions illustrated in FIGS. 3 and 5 are determined by the parameters (a, b) or (p, q). In the first embodiment, these parameters have fixed values, which are selected according to the signal modulation method and other design factors.

Figure 6:
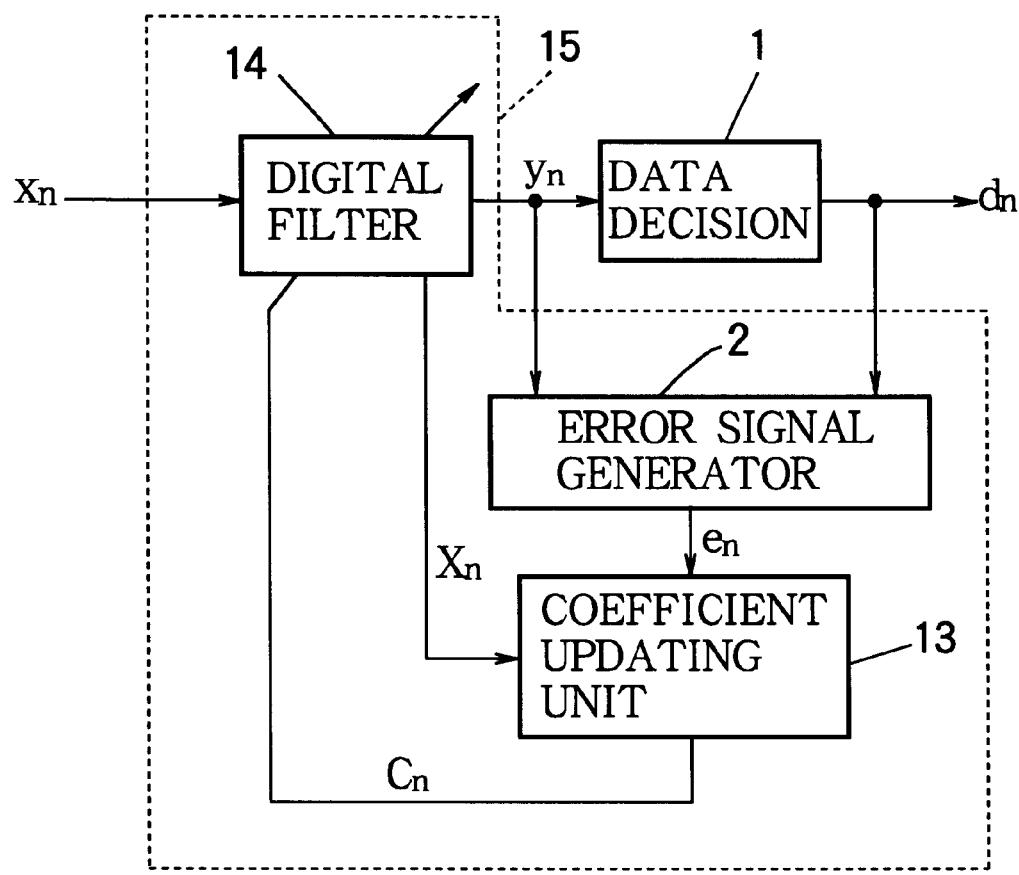
FIG. 6 is a block diagram showing a first example of the overall configuration of the first embodiment.

FIG. 6 shows a first example of the overall structure of the first embodiment. The error signal $e_n$ output from the error signal generator 2 is supplied to a coefficient updating unit 13 that adaptively updates the coefficients in a digital filter 14. The digital filter 14 receives a demodulated input signal $x_n$, and supplies the filtered signal $y_n$ to the data decision unit 1 and error signal generator 2. The error signal generator 2, coefficient updating unit 13, and digital filter 14 constitute an equalizer 15.

Figure 7:
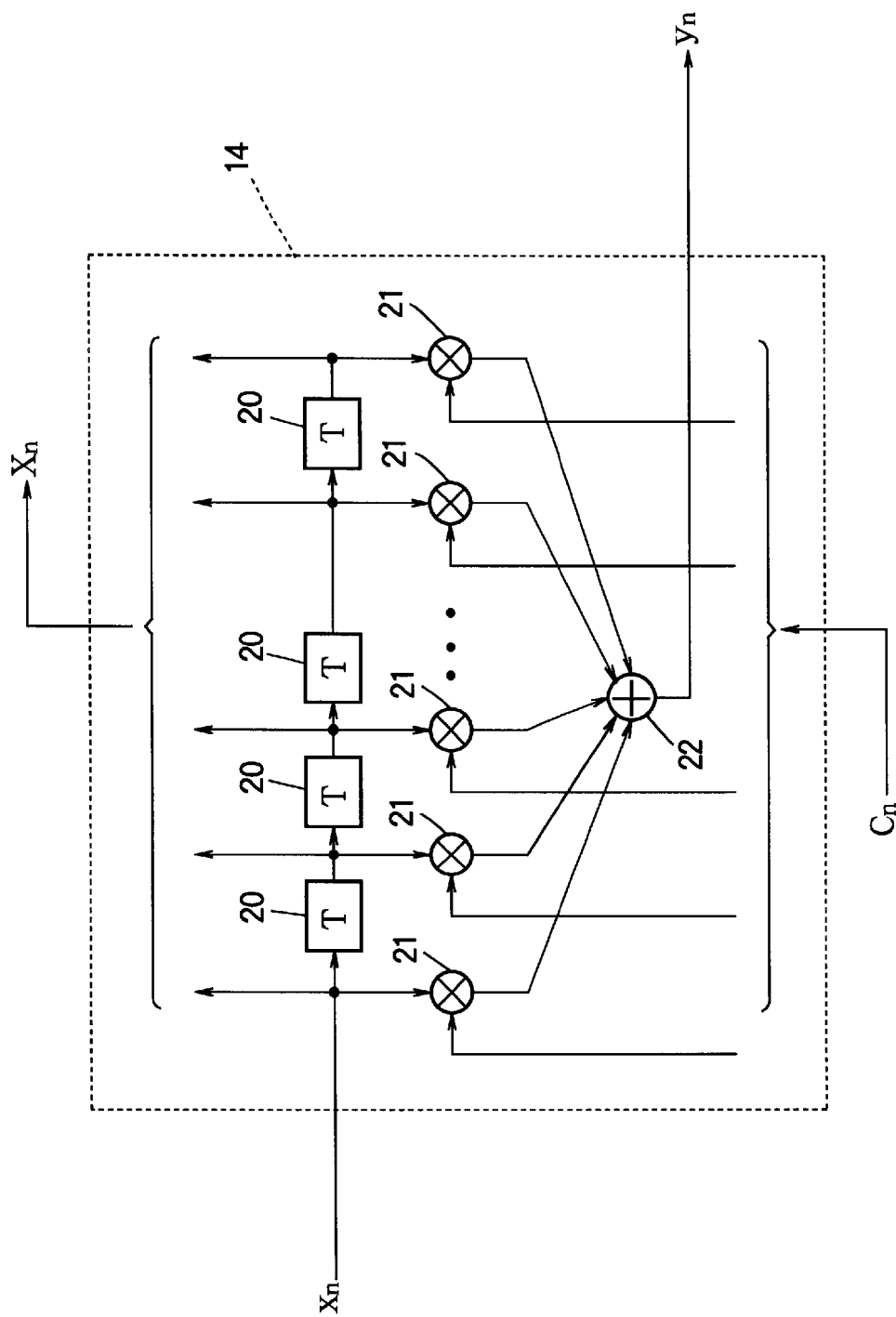
FIG. 7 is a block diagram showing the internal structure of the digital filter in FIG. 6.

FIG. 7 shows the internal structure of the digital filter 14. The input signal $x_n$ is supplied to a tapped delay line comprising storage elements or taps (T) 20 that store each received value for one discrete time unit. The tapped delay line thus stores the values $x_n, x_{n-1}, x_{n-2}, \ldots$. These values form a vector, denoted $X_n$, which is supplied to the coefficient updating unit 13 in FIG. 6 and to a plurality of multipliers 21. The coefficient updating unit 13 supplies the digital filter 14 with a vector of coefficients $C_n$ comprising coefficient values $C_{n,k}$ (k=0, 1, 2, ...). The multipliers 21 multiply $x_{n-k}$ by $C_{n,k}$ (k=0, 1, 2, ...). An adder 22 sums the resulting products to obtain the filtered signal $y_n$. If the input signal $x_n$ is complex-valued, as when QPSK or m-QAM modulation is employed, the multipliers 21 and adder 22 perform complex multiplication and addition.

Figure 8:
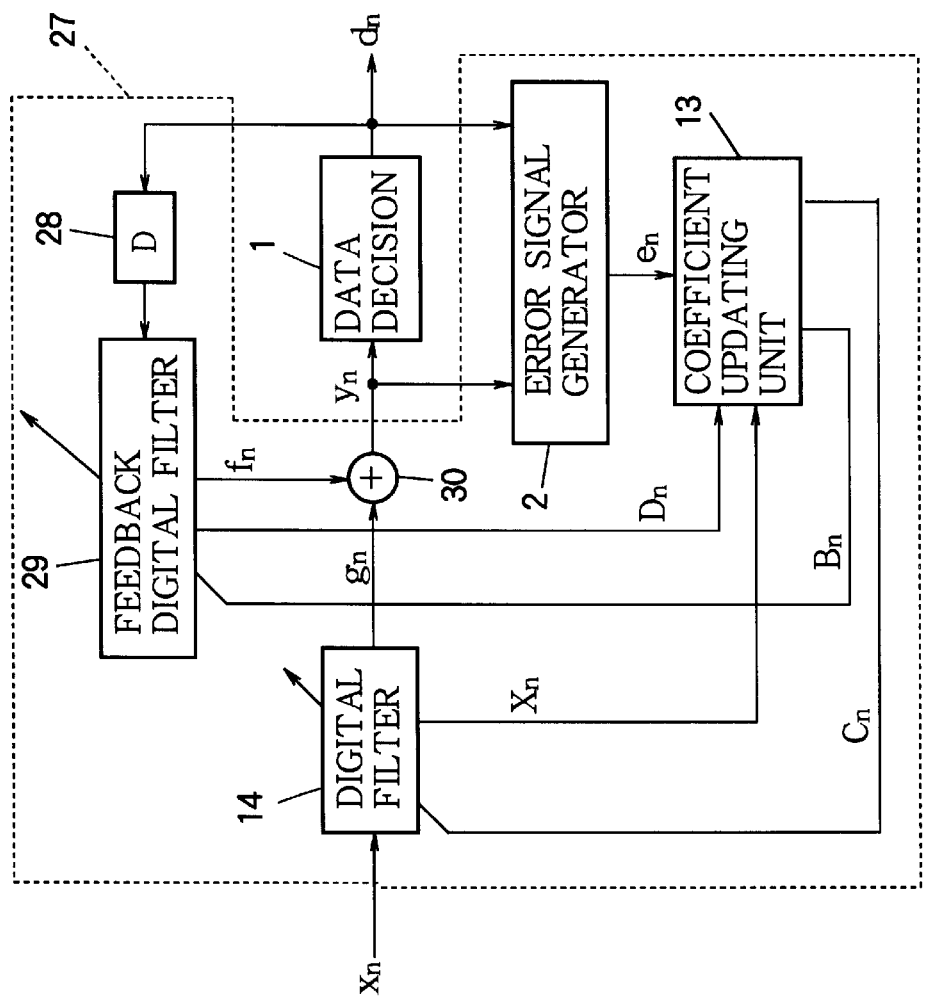
FIG. 8 is a block diagram showing a second example of the overall configuration of the first embodiment.

FIG. 8 shows a second example of the overall structure of the first embodiment. In this example, the equalizer 27 comprises a delay element (D) 28, a feedback digital filter 29, and an adder 30, as well as the error signal generator 2, coefficient updating unit 13, and digital filter 14. The delay element 28 stores each data value $d_n$ output from the data decision unit 1 for one discrete time unit. The feedback digital filter 29 filters the value stored in the delay element 28 to obtain a filtered feedback signal $f_n$. The digital filter 14 filters the input signal $x_n$ to obtain a filtered feed-forward signal $g_n$. The adder 30 adds the filtered feedback signal $f_n$ and filtered feed-forward signal $g_n$ to obtain the filtered signal $y_n$ supplied to the data decision unit 1 and error signal generator 2. The coefficient updating unit 13 updates the coefficients of both digital filters 14, 28.

Figure 9:
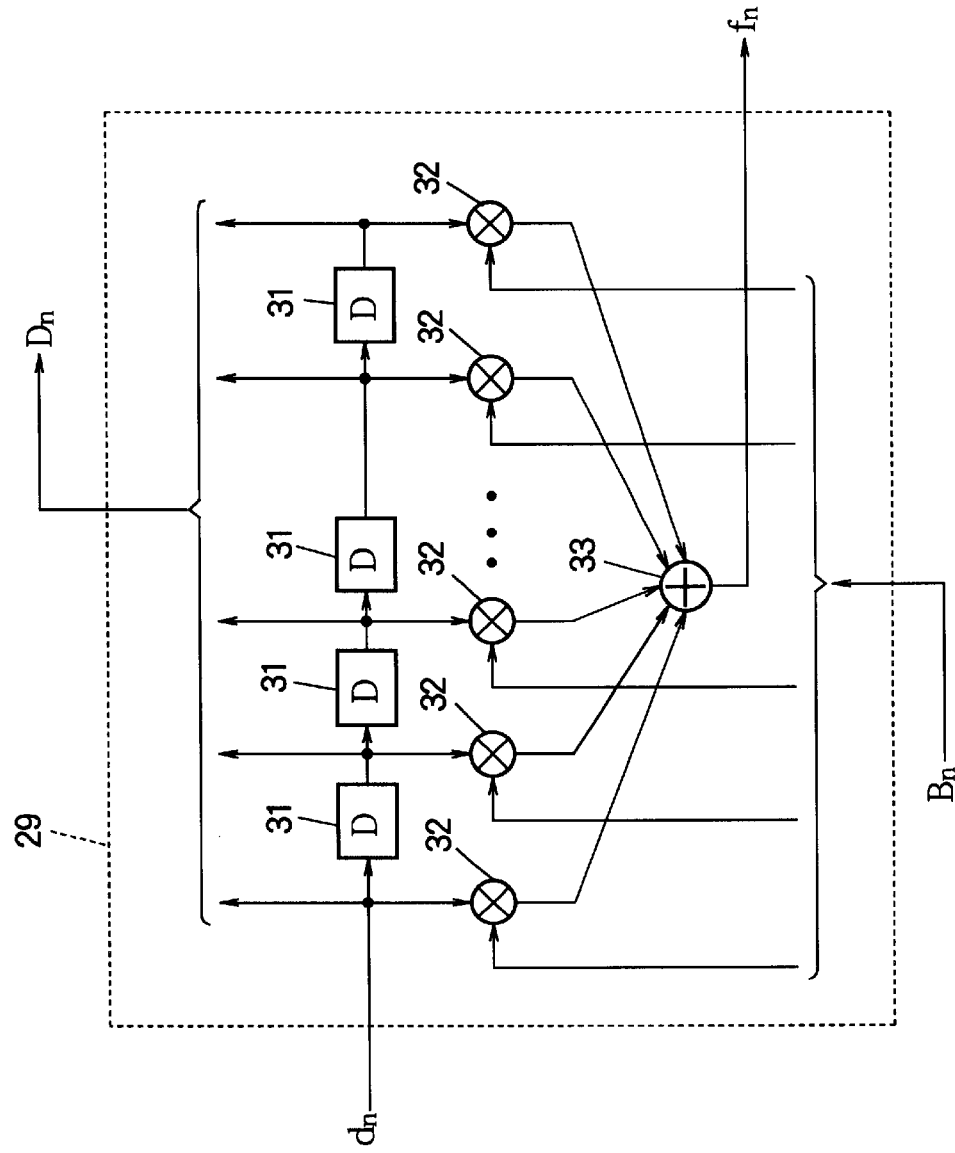
FIG. 9 is a block diagram showing the internal structure of the feedback digital filter in FIG. 8.

FIG. 9 shows the internal structure of the feedback digital filter 29. The data signal $d_n$ is supplied to a tapped delay line comprising storage elements or delay elements (D) 31. The stored values $d_n, d_n, d_{n-2}, \ldots$ constitute a vector $D_n$ which is supplied to the coefficient updating unit 13. The coefficient updating unit 13 supplies the feedback digital filter 29 with a coefficient vector $B_n$ comprising values $b_{n,k}$ (k=0, 1, 2, ...). The multipliers 32 multiply $d_{n-k}$ by $b_{n,k}$ (k=0, 1, 2, ...). An adder 33 sums the resulting products to obtain the filtered feedback hi signal $f_n$. If the data signal $d_n$ is complex-valued, the multipliers 32 and adder 33 perform complex multiplication and addition.

The feed-forward digital filter 14 in FIG. 8 has the structure shown in FIG. 7, the output signal being $g_n$ instead of $y_n$.

Next, the operation of the first embodiment will be described.

The input signal $x_n$ is produced by demodulation of a QPSK, m-QAM, or m-VSB signal received from a communication channel. The equalizer 15 in FIG. 6 or equalizer 27 in FIG. 8 operates so as to correct distortion introduced by the communication channel. The data decision unit 1 finds the data value $d_n$ that most closely matches the filtered signal $y_n$. If the 8-VSB modulation method is used, for example, the data decision unit 1 slices the $y_n$ values at predetermined amplitude levels to select the $d_n$ values. For QAM modulation, the data decision unit 1 finds the complex data value $d_n$ with real and imaginary parts that most closely match the real and imaginary parts of the filtered signal $y_n$. For QPSK modulation, the data decision unit 1 finds the complex data value $d_n$ with the phase shift or phase angle most closely matching that of the filtered signal $y_n$.

The error signal generator 2 uses the filtered signal $y_n$ and data signal $d_n$ to obtain the error signal $e_n$. The coefficient updating unit 13 uses the error signal $e_n$ to update the filter coefficients by, for example, the well-known least-mean squares (LMS) algorithm, also referred to as the stochastic gradient algorithm. For the filter coefficients $C_n$, this algorithm is described in vector notation as follows, where $\mu$ is a positive number less than unity.

$$C_{n+1} = C_n - \mu e_n X_n^*$$

$X_n^*$ denotes the vector of complex conjugates of $X_n$. For m-VSB modulation, $X_n$ and $X_n^*$ are identical, both being real. In FIG. 8, the filter coefficients $B_n$ are updated in a similar way, using the complex conjugates of the data values $(D_n^*)$ instead of using the vector $X_n^*$.

As can be understood from the description of the error signal generator 2, the error signal $e_n$ has the following value.

$$e_n = k_1 (1-w_n)(y_n - d_n) + k_2 w_n (|y_n|^2 - R) y_n$$

The positive constant R, referred to as a dispersion factor, is given by the following ratio, in which $E\{x\}$ denotes the expected value of x, and $a_n$ ranges over the constellation of data values predetermined by the signal modulation method.

$$R = E\{|a_n|^4\}/E\{|a_n|^2\}$$

During the initial stages of operation, before the filter coefficients have converged to appropriate values, the amplitude error $(y_n - d_n)$ tends to be large, because channel distortion has not been completely removed from the filtered signal $y_n$, and because the reliability of the data decisions made by the data decision unit 1 is low. The amplitude error also tends to be large when the input signal $x_n$ is incompletely demodulated, and when channel distortion is large. Under any of these conditions, the amplitude error $(y_n - d_n)$ itself is unreliable, but since its mean absolute value $\epsilon_n$ is large, the weighting coefficient $w_n$ is generally equal to unity. In FIG. 3, $w_n$ is equal to unity if $\epsilon_n$ is equal to or greater than $(1+b)/a$. In FIG. 5, $w_n$ is equal to unity if $\epsilon_n$ is equal to or greater than $(p+q)$. Under these conditions, the weighting coefficient $(1-w_n)$ supplied to the amplitude error signal weighting unit 4 is zero, and the weighted amplitude error $k_1(1-w_n)(y_n - d_n)$ is also equal to zero. The output error signal $e_n$ then consists entirely of the weighted squared envelope error $k_2 w_n(|y_n|^2 R) y_n$, which is more reliable because it does not depend on the unreliable data value $d_n$.

After the filter coefficients have converged, if channel distortion is not unduly large and the input signal $x_n$ is completely demodulated, the amplitude error $(y_n - d_n)$ tends to be small, because only slight distortion remains in the filtered signal $y_n$, and the data decision unit 1 almost always chooses the correct data value $d_n$. Under these conditions, the amplitude error $(y_n - d_n)$ is more reliable than the squared envelope error $(|y_n|^2 - R) y_n$. For example, if the filtered signal value $y_n$ is exactly equal to the data value $d_n$, the amplitude error is correctly equal to zero, but the squared envelope error is not necessarily equal to zero. Furthermore, the direction (phase angle or sign) of the weighted squared envelope error is always equal to the direction of the filtered value $y_n$, regardless of the true direction of the error. Since the mean absolute amplitude error $\epsilon_n$ is small, however, the weight $w_n$ is generally equal to zero. In FIG. 3, $w_n$ is equal to zero if $\epsilon_n$ is equal to or less than b/a. In FIG. 5, $w_n$ is equal to zero if $\epsilon_n$ is equal to or less than (p−q). Under these conditions, the weighted squared envelope error component $k_2 w_n (|y_n|^2 - R) y_n$ is equal to zero, and the output error signal $e_n$ consists entirely of the amplitude error component.

In both of the above cases, the error signal generator 2 supplies the subtractor 3 with an error signal from which unreliable components have been removed.

As a result, under initial conditions or unfavorable reception conditions, convergence of the filter coefficients is not slowed by the use of large, incorrect amplitude error values. Convergence is consequently rapid.

After convergence, under favorable reception conditions, the filter coefficients are maintained at substantially their optimum values, without being perturbed by squared envelope error components that do not represent true error. Consequently, the persistent residual error is low.

Conditions intermediate between these two cases, e.g. when the mean absolute amplitude error $\epsilon_n$ is near p in FIG. 5, are handled with an appropriate mixture of amplitude error and squared envelope error, so there is a smooth transition between the use of amplitude error and squared envelope error. This avoids the disruption that would be caused by an abrupt switchover from one type of error signal to the other.

Figure 10:
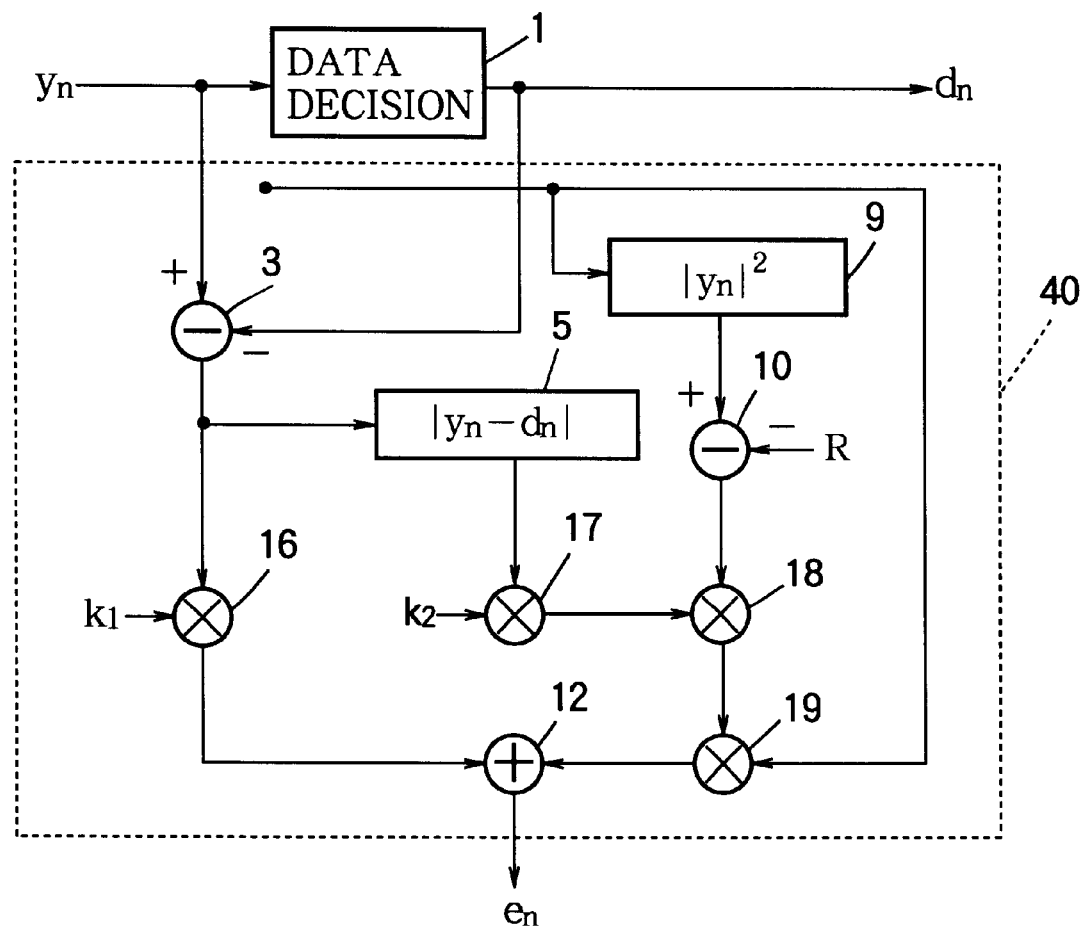
FIG. 10 is a block diagram showing the internal structure of a conventional error signal generator.

For comparison, FIG. 10 shows a conventional error signal generator 40 comprising subtractors 3, 10, an absolute value calculation unit 5, a squared envelope calculation unit 9, and an adder 12 as described above, and multipliers 16, 17, 18, 19. The amplitude error $(y_n - d_n)$ output from the subtractor 3 is multiplied by the fixed constant $k_1$ in multiplier 16. The absolute amplitude error $|y_n - d_n|$ is multiplied by the fixed constant $k_2$ in multiplier 17, then by the squared envelope error $(|y_n|^2 - R)$ in multiplier 18, and finally by the filtered signal $y_n$ in multiplier 19. Adder 12 adds the outputs of multipliers 16 and 19 to obtain the following error signal $e_n$.

$$e_n = k_1(y_n - d_n) + k_2 |y_n - d_n|(|y_n|^2 - R) y_n$$

In this error signal, the amplitude error component $k_1(y_n - d_n)$ is present at full strength even during the initial stages of convergence, when the amplitude error value is unreliable. The squared envelope error component $k_2 |y_n - d_n|(|y_n|^2 - R) y_n$ moreover remains present even after convergence is completed, the direction (phase angle or sign) of this component incorrectly reflecting the direction of $y_n$ instead of the true direction of the error. Accordingly, convergence of the filter coefficients is neither as rapid nor as stable as in the first embodiment, and after convergence is completed, there is a comparatively large persistent residual error in the filtered signal $y_n$.

Next, a second embodiment will be described. Like the first embodiment, the second embodiment reduces the weight of the amplitude error signal when the mean absolute amplitude error is large, but the second embodiment does not reduce this weight to zero.

Figure 11:
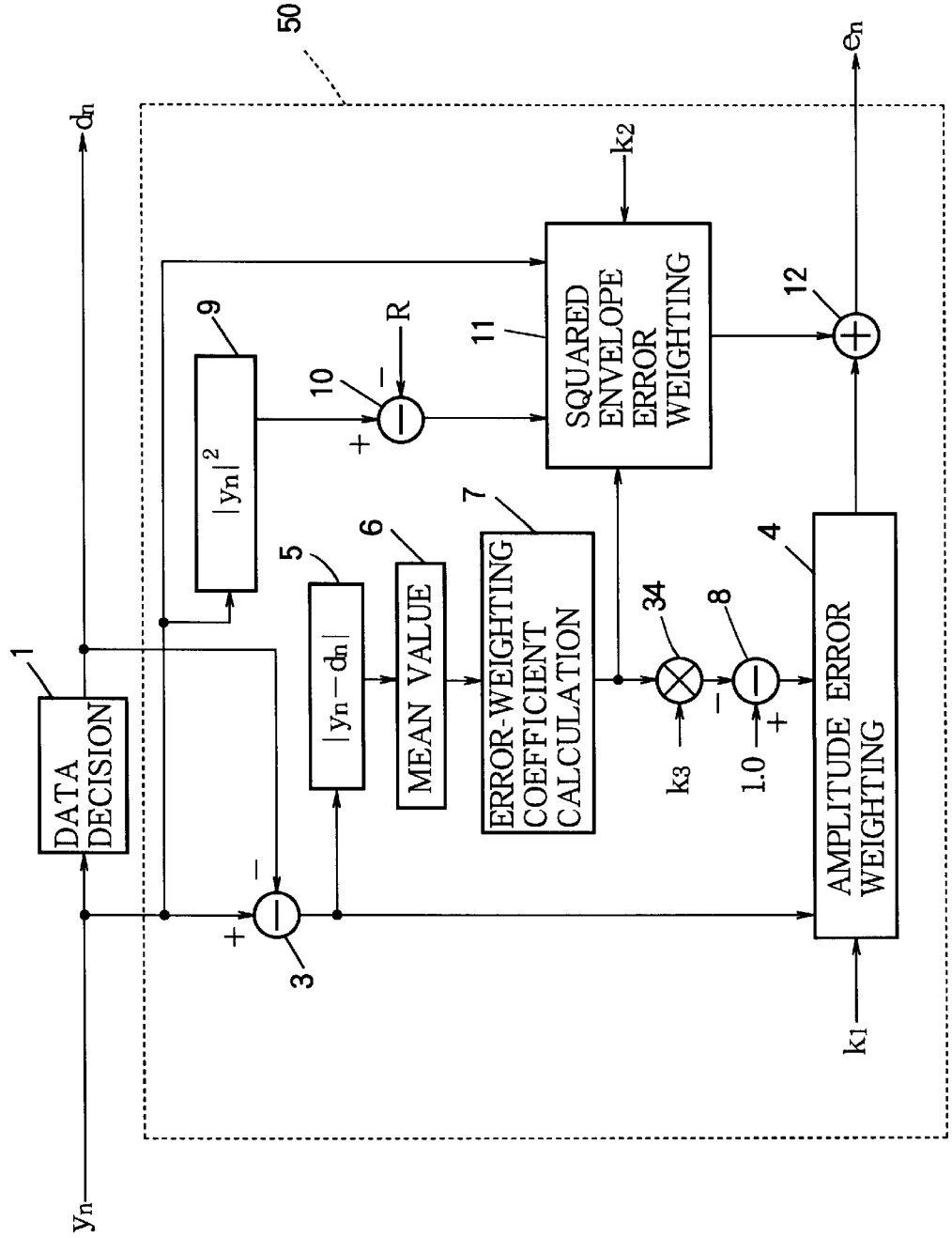
FIG. 11 is a block diagram showing the internal structure of the error signal generator in a second embodiment of the invention.

Referring to FIG. 11, the error signal generator 50 in the second embodiment adds a multiplier 34 to the configuration of the first embodiment. This multiplier 34 multiplies the weighting coefficient $w_n$ output from the error-weighting coefficient calculation unit 7 by a fixed constant $k_3$, which is greater than zero but less than one. The subtractor 8 subtracts the resulting product $k_3w_n$ from unity to generate a weighting coefficient $(1-k_3w_n)$ that is always greater than zero. The amplitude error signal weighting unit 4 employs this non-zero weighting coefficient. The error signal $e_n$ obtained in the second embodiment has the following form.

$$e_n = k_1(1-k_3w_n)(y_n-d_n) + k_2w_n(|y_n|^2-R)y_n$$

Since $(1-k_3w_n)$ is always greater than zero, even when the mean absolute amplitude error is large and $w_n$ is equal to unity, the error signal $e_n$ includes a non-zero amplitude-error component. As noted above, the reliability of this component is low, but the information provided by this component is not completely meaningless. Inclusion of this component in the error signal, at a reduced but non-zero weighted level, has been found to speed up the initial convergence of the filter coefficients, and to improve equalization performance under conditions of large channel distortion or incomplete demodulation.

When the mean absolute amplitude error is small and $w_n$ is equal to zero, the error signal $e_n$ consists entirely of the amplitude error component, with no squared envelope error component, and the second embodiment operates in the same way as the first embodiment.

Figure 12:
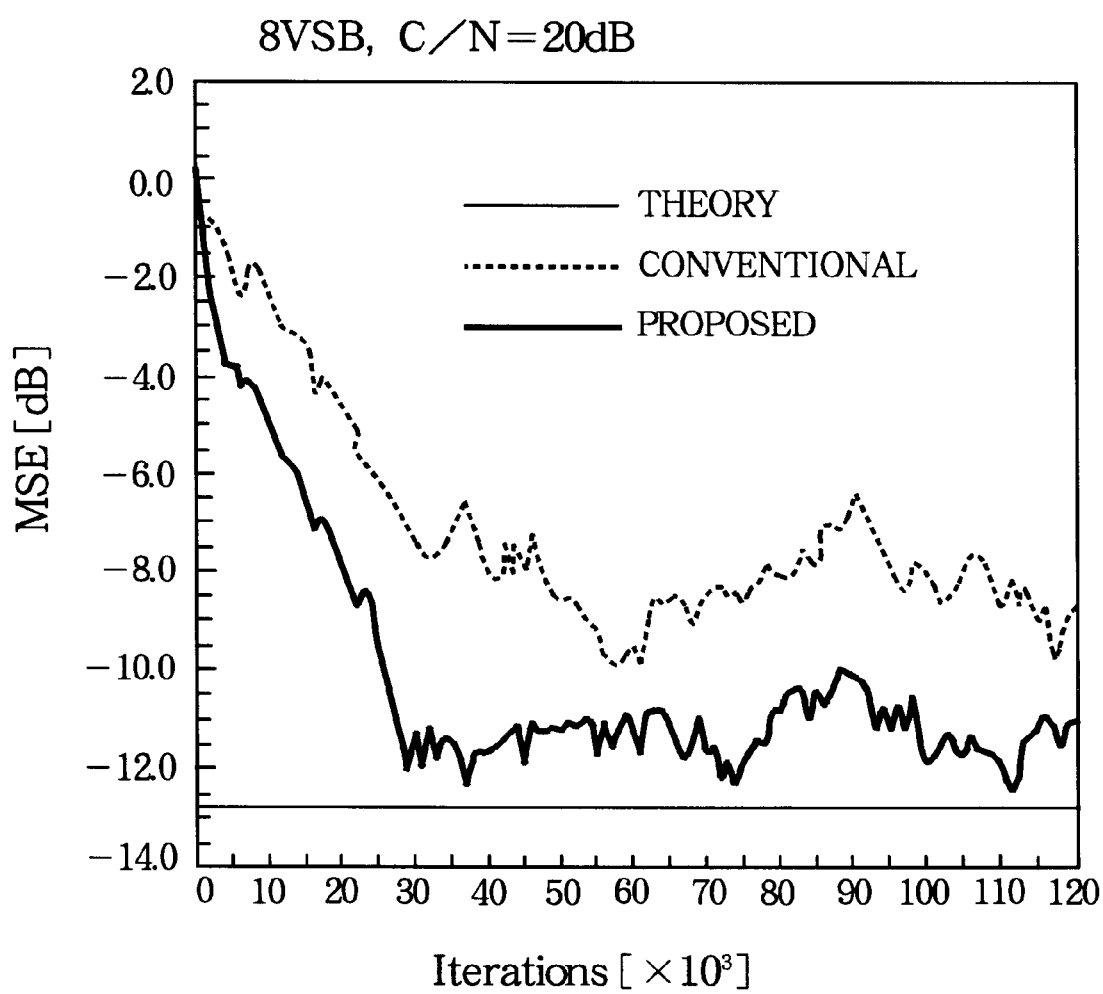
FIG. 12 is a graph illustrating the performance of the second embodiment.

FIG. 12 compares the performance of the second embodiment with the performance of a conventional equalizer having the error signal generator shown in FIG. 10. The data were obtained by simulation, starting from an initial state in which the filter coefficients were unconverged. The simulated transmitted signal was an 8-VSB signal with a 10.76-megahertz symbol rate.

The horizontal axis in FIG. 12 represents time. The number of iterations is the number of times the filter coefficients have been updated. The vertical axis indicates the residual mean square error (MSE), calculated by squaring the difference between the filtered signal $y_n$ and the actual transmitted data value, taking the mean of these squared values over the most recent one thousand symbols, and converting the result to decibel units (dB) referenced to the current signal level.

The transmission channel was assumed to be affected by frequency-selective fading, Rayleigh fading, and additive white Gaussian noise. Frequency-selective fading was assumed to take the form of a principal or desired wave (D) and five delayed or undesired waves (U) with the parameters in Table 1.

TABLE 1

| Delay | Attenuation (D/U) | Phase |
|---|---|---|
| −1.8 µs | 18 dB | 179.67528° |
| 0.15 µs | 20 dB | −108.32472° |
| 1.8 µs | 20 dB | −36.32472° |
| 5.7 µs | 10 dB | 35.67528° |
| 18 µs | 14 dB | 107.67528° |

The Rayleigh fading component had a dc gain of 0.25 with respect to the principal wave, and a Doppler frequency of 500 Hz. The mean carrier-to-noise ratio (C/N) of the transmitted signal was twenty decibels (20 dB).

The equalizer configuration shown in FIG. 8 was used. The feed-forward digital filter 14 had sixty-four taps. The feedback digital filter 29 had two hundred taps. The input signal rate to the equalizer 27 was equal to the output rate from the data decision unit 1. The error-weighting coefficient calculation unit 7 had the configuration shown in FIG. 4. The parameters p and q had values of 0.5 and 0.05, respectively. The fixed constants $k_1$, $k_2$, $k_3$ had values of 10, 0.1, and 0.75, respectively. The value of the parameter $\mu$ was 0.000005.

The dotted curve in FIG. 12 indicates the performance of the conventional equalizer. The solid dark curve indicates the performance of the second embodiment. The solid light line indicates the theoretical performance limit for a 20-dB carrier-to-noise ratio. The simulation showed that the filter coefficients converged faster in the second embodiment than in the conventional equalizer, and after convergence was achieved, the residual mean square error was smaller in the second embodiment than in the conventional equalizer.

Next, a third embodiment will be described. The third embodiment switches the parameters used in the second embodiment according to the modulation method.

Figure 13:
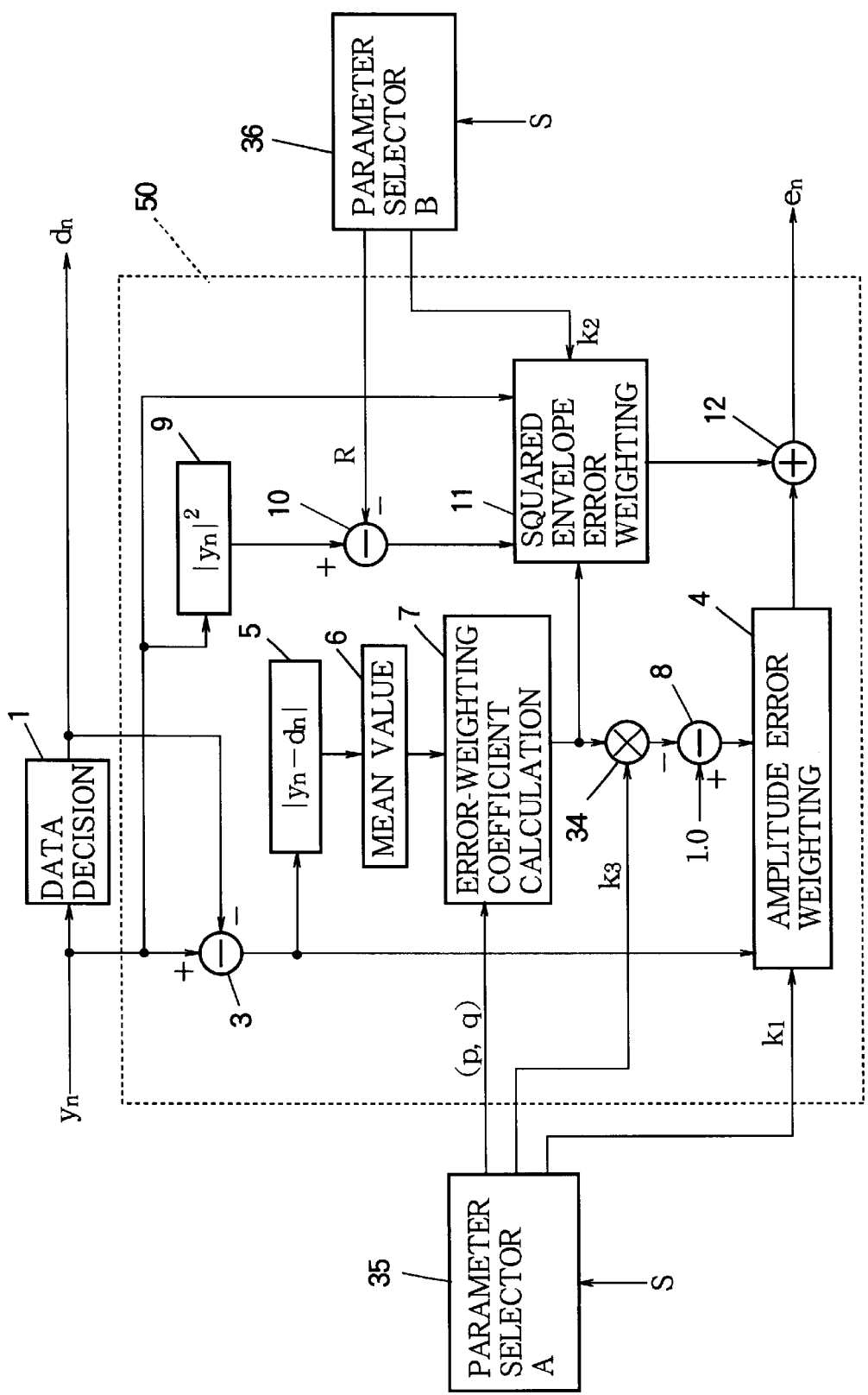
FIG. 13 is a block diagram showing the internal structure of the error signal generator in a third embodiment of the invention.

Referring to FIG. 13, the third embodiment adds a pair of parameter selectors 35, 36 to the configuration of the second embodiment. Both parameter selectors 35, 36 receive a signal S that designates a particular modulation method, such as QPSK, 16-QAM, or 8-VSB. Parameter selector 35, also identified as parameter selector A, supplies parameters defining the conversion function to the error-weighting coefficient calculation unit 7, supplies the first fixed constant $k_1$ to the amplitude error signal weighting unit 4, and supplies the third fixed constant $k_3$ to the multiplier 34. The parameters defining the conversion function are shown as (p, q), as in FIGS. 4 and 5, but other parameters, such as the parameters (a, b) in FIGS. 2 and 3, may be used. Parameter selector 36, also identified as parameter selector B, supplies the dispersion factor R to the subtractor 10, and the second fixed constant $k_2$ to the squared envelope error signal weighting unit 11.

The signal S is, for example, a multiple-bit signal that is programmed externally, e.g. by writing bit values in a register (not visible), or connecting input terminals (not visible) to power-supply and ground voltages. The parameter selectors 35, 36 operate as decoders that decode S to obtain predetermined parameter values suitable for each modulation method. The fixed constants $k_1$, $k_2$, $k_3$ are fixed by the value of S, but may of course change in value if S is changed.

Once the value of S has been programmed, the third embodiment operates in the same way as the second embodiment. The third embodiment enables a manufacturer to manufacture and stock a single type of equalizer, which can be programmed by input of S for operation under various modulation methods.

The first and second embodiments used parameter values which cannot be changed, requiring the manufacture of different equalizers for different modulation methods.

The two parameter selectors 35, 36 in the third embodiment may be combined into a single parameter selector.

Next, a fourth embodiment will be described.

Figure 14:
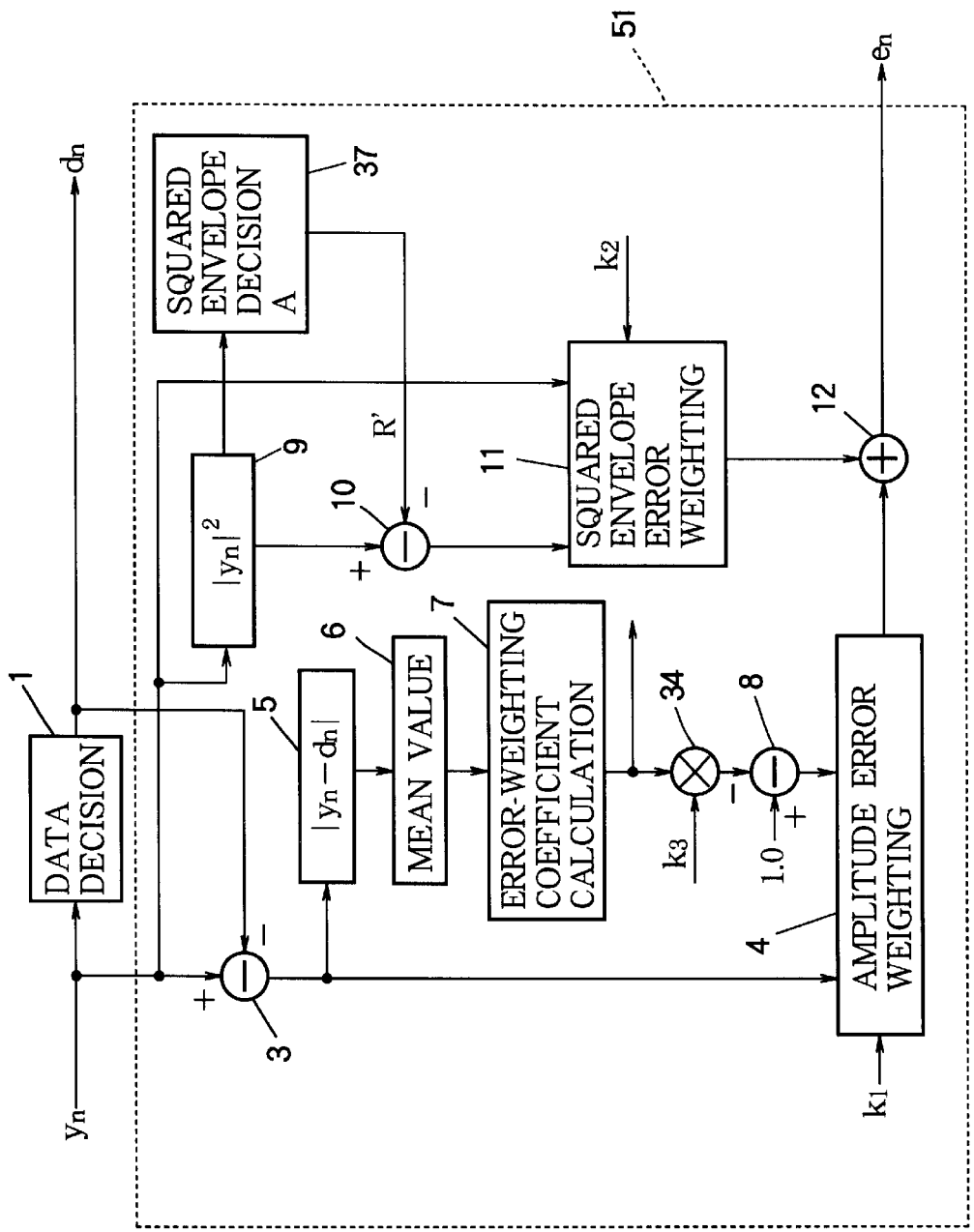
FIG. 14 is a block diagram showing the internal structure of the error signal generator in a fourth embodiment of the invention.

Referring to FIG. 14, the error signal generator 51 in the fourth embodiment adds a squared envelope decision unit 37 to the configuration of the second embodiment. This unit 37, also identified as squared envelope decision unit A, receives the squared envelope signal output by the squared envelope calculation unit 9 and determines a dispersion factor R' which is supplied to the subtractor 10 in place of the fixed dispersion factor R of the second embodiment.

The details of the determination of R' depend on the modulation method. The determination of R' for the 16-QAM modulation method will be described below as an example.

Figure 15:
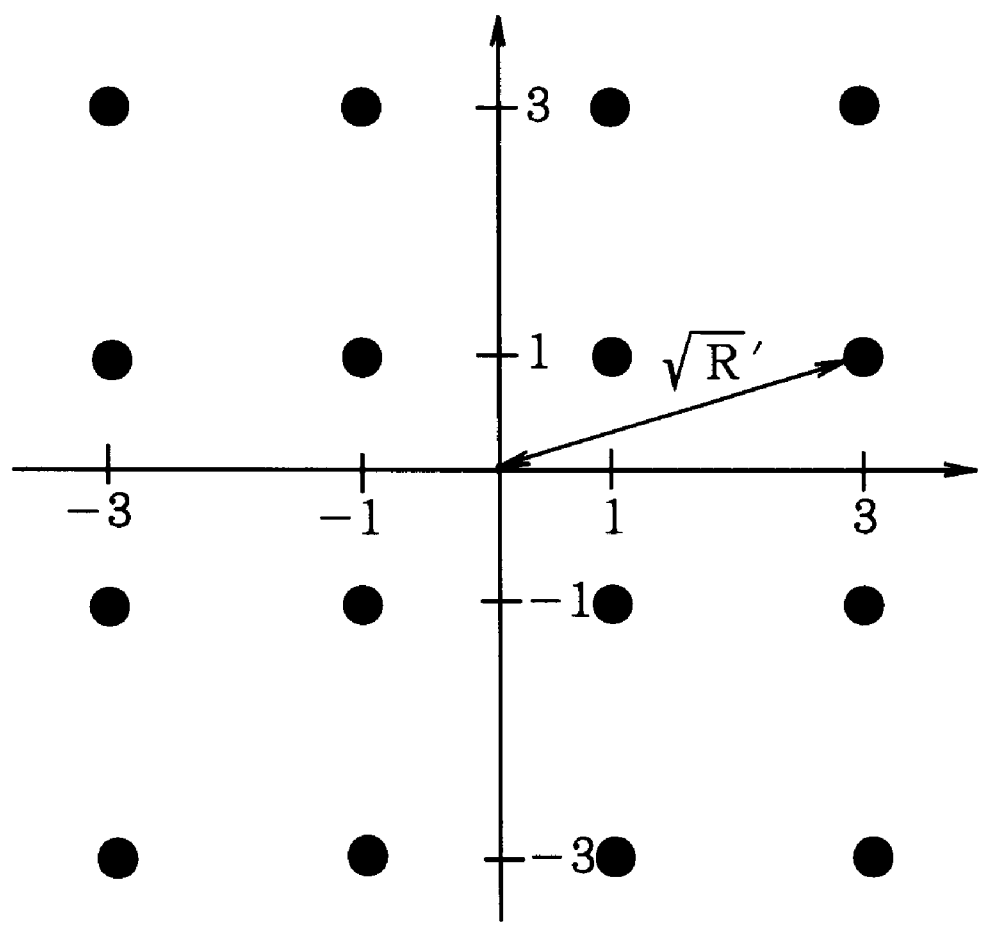
FIG. 15 illustrates the square root of the dispersion factor in the third embodiment.

Referring to FIG. 15, the in-phase (I) and quadrature (Q) carrier components of the 16-QAM signal are modulated to have amplitudes that, for each component, may take on four equally-spaced values (shown as −3, −1, 1, 3). Under ideal conditions, without channel distortion or noise, the squared envelope signal output by the squared envelope calculation unit 9 should have one of only three values (2, 10, 18). As R', the squared envelope decision unit 37 selects whichever of these three values is closest to the actual value $|y_n|^2$ output from the squared envelope calculation unit 9. The square root of R' is equal to the distance from the origin to one of the data points in the 16-QAM constellation, as shown by the arrow, which corresponds to R'=10.

The error signal $e_n$ output by the error signal generator 51 in the fourth embodiment has the following form.

$$e_n = k_1(1-k_3 w_n)(y_n - d_n) + k_2 w_n (|y_n|^2 - R'_n) y_n$$

The subscript n indicates that $R'_n$ varies, depending on the squared envelope value $|y_n|^2$ at time n.

Use of this error signal improves the accuracy of the weighted squared envelope error component $k_2 w_n (|y_n|^2 - R'_n) y_n$ in modulation methods such as m-QAM and m-VSB, in which the ideal squared envelope has several different values. The initial convergence speed is thereby improved, and equalization performance is also improved under channel conditions that produce medium or large amplitude errors.

Next, a fifth embodiment will be described. The fifth embodiment combines the features of the third and fourth embodiments.

Figure 16:
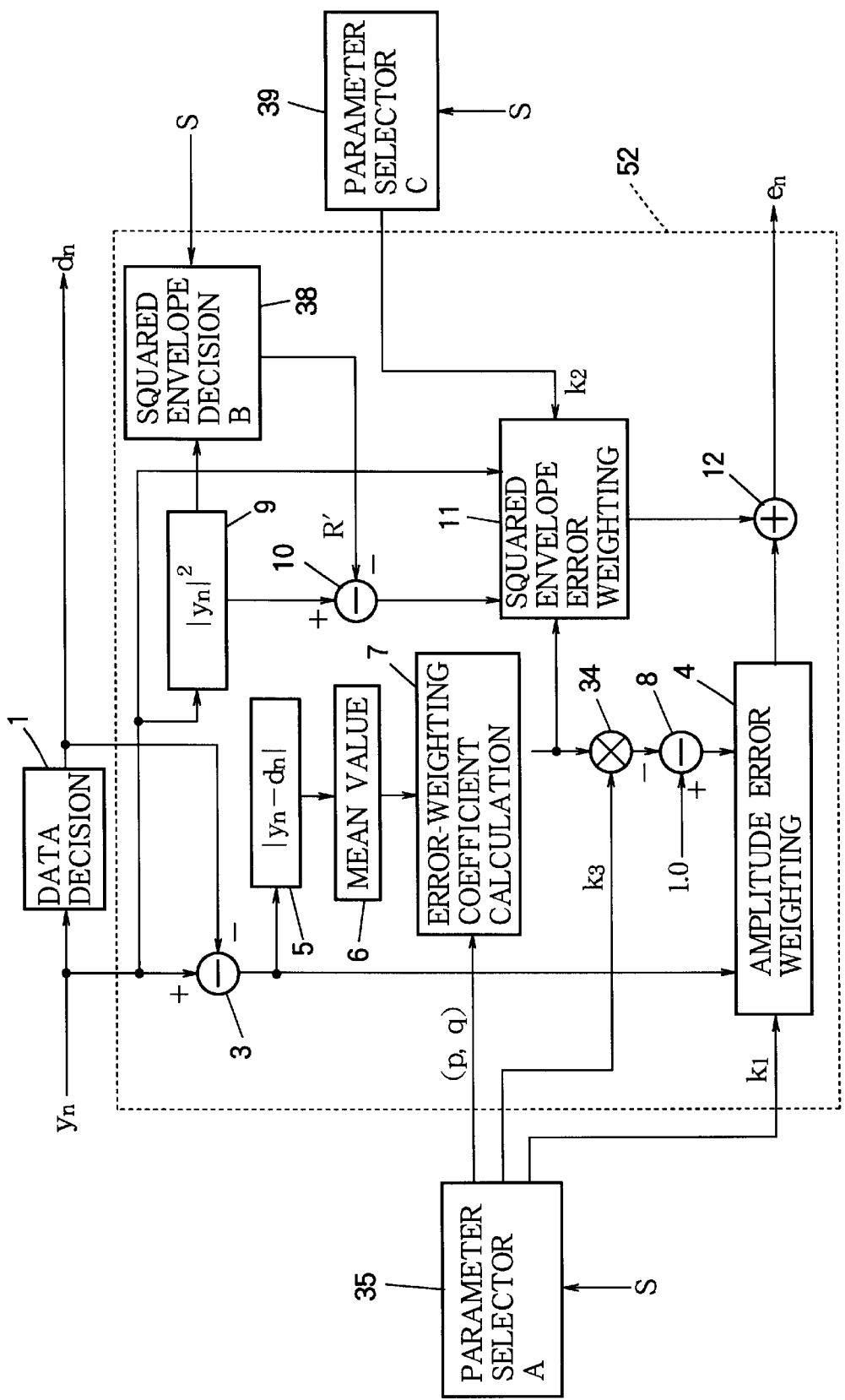
FIG. 16 is a block diagram showing the internal structure of the error signal generator in a fifth embodiment of the invention.

Referring to FIG. 16, the error signal generator 52 in the fifth embodiment has a squared envelope decision unit 38, also identified as squared envelope decision unit B, that receives both the squared envelope signal $|y_n|^2$ output from the squared envelope calculation unit 9 and the signal S described in the third embodiment, designating the modulation method. The squared envelope decision unit 38 determines a dispersion factor R' by selecting the ideal squared envelope value that is closest to $|y_n|^2$ in the modulation method designated by the signal S.

The fifth embodiment also includes the parameter selector (A) 35 described in the third embodiment, which supplies values of the parameters (a, b) or (p, q) and constants $k_1$ and $k_3$ according to the designated modulation method, and a parameter selector (C) 39 that supplies the squared envelope error signal weighting unit 11 with a value of constant $k_2$ determined according to the designated modulation method.

The operation of the fifth embodiment can be understood from the foregoing description of the operation of the third and fourth embodiments. Compared with the third embodiment, the fifth embodiment provides improved convergence performance when an m-QAM or m-VSB modulation method is designated by the signal S.

The two parameter selectors 35, 39 in the fifth embodiment may be combined into a single parameter selector.

Next, a sixth embodiment will be described. The error-weighting coefficient calculation unit 7 in the sixth embodiment uses the absolute amplitude error instead of the mean value thereof.

Figure 17:
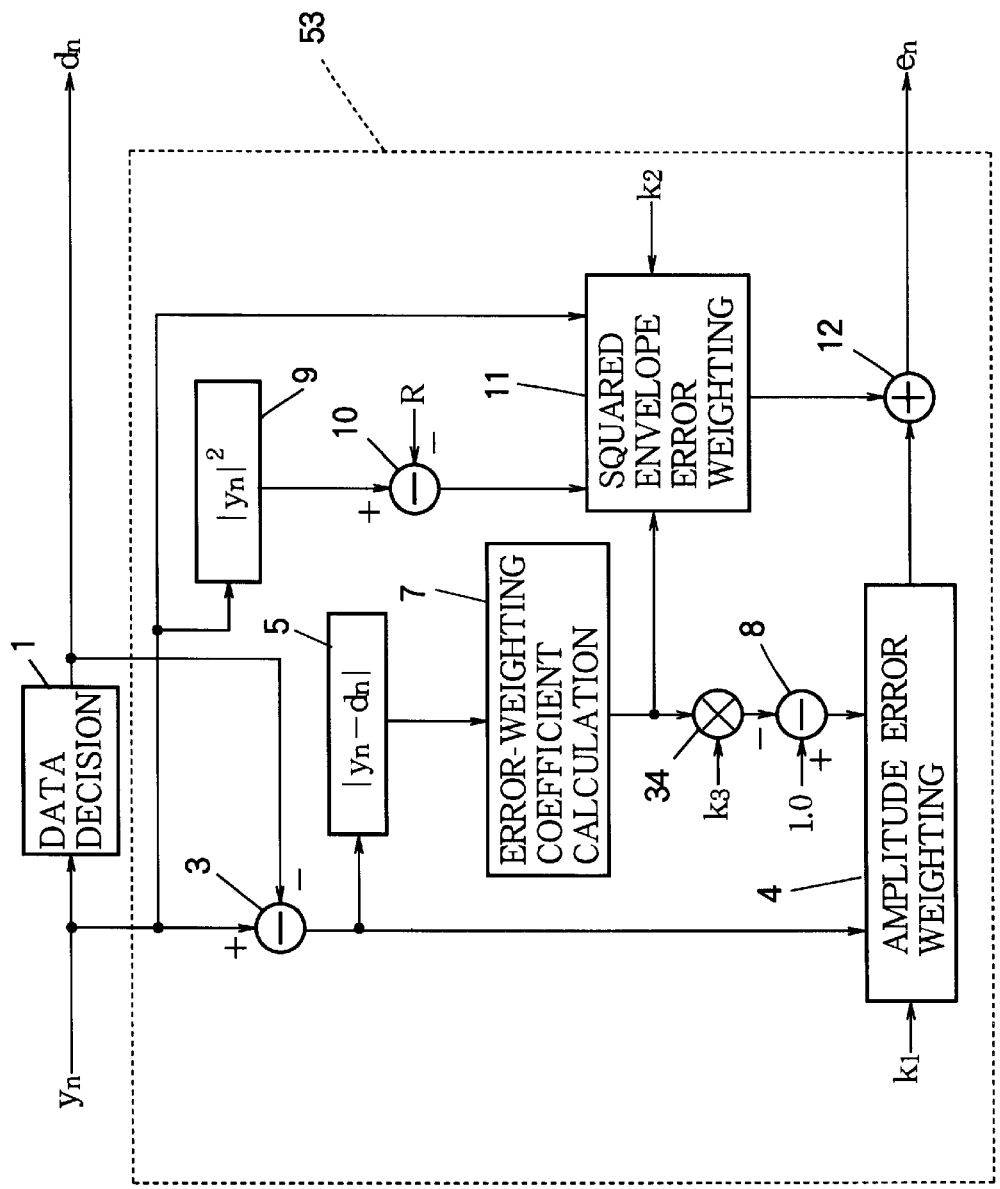
FIG. 17 is a block diagram showing the internal structure of the error signal generator in a sixth embodiment of the invention.

Referring to FIG. 17, the error signal generator 53 in the sixth embodiment is similar to the error signal generator in the second embodiment, except that there is no mean value calculation unit. The absolute amplitude error $|y_n - d_n|$ output from the absolute value calculation unit 5 is supplied directly to the error-weighting coefficient calculation unit 7. The error-weighting coefficient calculation unit 7 operates as described in the first embodiment, using the absolute amplitude error $|y_n - d_n|$ in place of the mean value $\epsilon_n$.

Aside from this difference, all of the elements in the sixth embodiment operate as described in the first and second embodiments.

Compared with the second embodiment, the sixth embodiment has a simpler configuration, because the mean value calculation unit is eliminated, and responds more quickly to changes in channel conditions, because the delay associated with taking the mean value is eliminated.

The invention has been described in relation to the QPSK, m-QAM, and m-VSB modulation methods, but is not limited to use with these modulation methods.

The conversion function used to obtain the weighting coefficients from the absolute amplitude error is not limited to the examples shown in FIGS. 3 and 5. The weighting coefficient $w_n$ supplied to the squared envelope error signal weighting unit 11 should be zero when the absolute amplitude error, or mean absolute amplitude error, is less than a first positive value. As the absolute amplitude error, or mean absolute amplitude error, increases from the first positive value to a second positive value, the weighting coefficient $w_n$ should increase, and the weighting coefficient supplied to the amplitude error signal weighting unit 4 should decrease. Any weighting coefficients satisfying these conditions can be used. Depending on the way in which the weighting coefficients are calculated, the first and second fixed constants $k_1$ and $k_2$ may be set equal to unity.

Those skilled in the art will recognize that further variations are possible within the scope claimed below.

What is claimed is:

1. An equalizing apparatus of the type having a digital filter filtering a received signal to correct channel distortion, a data decision unit receiving a filtered signal from the digital filter and generating a data signal from the filtered signal by selecting a closest matching data value from a plurality of data values predetermined according to a signal modulation method, an error signal generator receiving the filtered signal and the data signal and generating an error signal, and a coefficient updating unit updating filter coefficients in the digital filter according to the error signal, the error signal generator comprising:

an amplitude error signal generator generating an amplitude error signal from said filtered signal and said data signal;

a squared envelope error signal generator generating a squared envelope error signal from a squared envelope value of said filtered signal;

a weighting coefficient calculation unit calculating a weighting coefficient from an absolute value of said amplitude error signal, according to a predetermined conversion function;

an amplitude error signal weighting unit weighting said amplitude error signal according to a first fixed constant and said weighting coefficient to obtain a weighted amplitude error signal;

a squared envelope error signal weighting unit weighting said squared envelope error signal according to a second fixed constant and said weighting coefficient to obtain a weighted squared envelope error signal; and an adder adding said weighted amplitude error signal and said weighted squared envelope error signal to obtain the error signal output by said error signal generator.

2. The equalizing apparatus of claim 1, wherein said weighting coefficient calculation unit calculates said weighting coefficient from a mean value of said absolute value of said amplitude error signal.

3. The equalizing apparatus of claim 1, also having a parameter selection unit receiving a signal specifying said signal modulation method and generating therefrom said first fixed constant, said second fixed constant, and parameters of the conversion function used by said weighting coefficient calculation unit.

4. The equalizing apparatus of claim 1, wherein said error signal generator further comprises a multiplier multiplying said weighting coefficient by a third fixed constant for input to said amplitude error signal weighting unit.

5. The equalizing apparatus of claim 4, also having a parameter selection unit receiving a signal specifying said signal modulation method and generating therefrom said first fixed constant, said second fixed constant, said third fixed constant, and parameters of the conversion function used by said weighting coefficient calculation unit.

6. The equalizing apparatus of claim 1, wherein said error signal generator further comprises an envelope decision unit receiving the squared envelope value of said filtered signal from said squared envelope error signal generator, selecting an ideal value closest to said squared envelope value according to said signal modulation method, and supplying said ideal value to said squared envelope error signal generator, said squared envelope error signal generator obtaining said squared envelope error signal by subtracting said ideal value from said squared envelope value.

7. The equalizing apparatus of claim 6, also having a parameter selection unit receiving a signal specifying said signal modulation method and generating therefrom said first fixed constant, said second fixed constant, and parameters of the conversion function used by said weighting coefficient calculation unit, said envelope decision unit also receiving said signal specifying said signal modulation method.

8. The equalizing apparatus of claim 1, wherein said signal modulation method comprises quadrature phase-shift keying.

9. The equalizing apparatus of claim 1, wherein said signal modulation method comprises multi-level quadrature amplitude modulation.

10. The equalizing apparatus of claim 1, wherein said signal modulation method comprises multi-level vestigial sideband modulation.

11. A method of equalizing an input signal to correct channel distortion, by using a digital filter to generate a filtered signal from the input signal, the filtered signal being provided to a data decision unit that selects a closest matching data value from a plurality of data values predetermined according to a signal modulation method, comprising the steps of:

(a) calculating an amplitude error signal from said filtered signal and said data value;

(b) calculating a squared envelope error signal from a squared envelope value of said filtered signal;

(c) calculating a first weighting coefficient from an absolute value of said amplitude error signal, said first weighting coefficient increasing from zero to a positive weighting value as said absolute value increases from a first positive value to a second positive value;

(d) calculating a second weighting coefficient that decreases as said absolute value increases from said first positive value to said second positive value;

(e) weighting said amplitude error signal according to a first fixed constant and said second weighting coefficient to obtain a weighted amplitude error signal;

(f) weighting said squared envelope error signal according to a second fixed constant and said first weighting coefficient to obtain a weighted squared envelope error signal;

(g) adding said weighted amplitude error signal and said weighted squared envelope error signal to obtain an error signal; and (h) updating coefficients of said digital filter according to said error signal.

12. The method of claim 11, wherein the absolute value used in said step (c) is a mean absolute value.

13. The method of claim 11, wherein said second weighting coefficient is always greater than zero.

14. The method of claim 11, further comprising the step of selecting said first positive value, said second positive value, said first fixed constant, and said second fixed constant according to said signal modulation method.

15. The method of claim 11, wherein said step (b) further comprises the steps of:

calculating a squared absolute value of said filtered signal;

selecting an ideal value most closely matching the squared absolute value of said filtered signal according to said signal modulation method; and taking a difference between said ideal value and the squared absolute value of said filtered signal; and multiplying said difference by said filtered signal.

16. The method of claim 11, wherein said signal modulation method comprises quadrature phase-shift keying.

17. The method of claim 11, wherein said signal modulation method comprises multi-level quadrature amplitude modulation.

18. The method of claim 11, wherein said signal modulation method comprises multi-level vestigial sideband modulation.

* * * * *